(12) United States Patent
Winiecki et al.

(10) Patent No.: US 9,431,967 B2
(45) Date of Patent: Aug. 30, 2016

(54) DYNAMIC AMPLIFIER SUPPLY

(71) Applicant: Sequans Communications Limited, Reading (GB)

(72) Inventors: Thomas Winiecki, Reading (GB); Gregory G. F. Fron, Reading (GB)

(73) Assignee: Sequans Communications Limited, Reading (GB)

( * ) Notice: Subject to any disclaimer, the term of this patent is extended or adjusted under 35 U.S.C. 154(b) by 0 days.

(21) Appl. No.: 14/334,968

(22) Filed: Jul. 18, 2014

(65) Prior Publication Data

US 2015/0022271 A1   Jan. 22, 2015

(30) Foreign Application Priority Data

Jul. 18, 2013  (EP) .................................... 13177138

(51) Int. Cl.
*H04W 24/00* (2009.01)
*H03F 1/02* (2006.01)
*H03F 1/32* (2006.01)
*H03F 3/19* (2006.01)
*H03F 3/24* (2006.01)
*H03F 3/189* (2006.01)
*H04B 1/04* (2006.01)

(52) U.S. Cl.
CPC .......... *H03F 1/0216* (2013.01); *H03F 1/0233* (2013.01); *H03F 1/3241* (2013.01); *H03F 3/189* (2013.01); *H03F 3/19* (2013.01); *H03F 3/24* (2013.01); *H03F 3/245* (2013.01); *H03F 2200/102* (2013.01); *H03F 2200/451* (2013.01); *H04B 2001/0408* (2013.01)

(58) Field of Classification Search
USPC .......... 455/67.14, 127.1, 13.4, 114.3, 127.2, 455/115.1, 423, 115.3, 450, 425, 67.11; 375/296, 260, 130, 267, 224, 295, 219, 375/292, 329, 297; 330/199, 191, 149, 131, 330/297, 127, 296, 279, 254

See application file for complete search history.

(56) References Cited

U.S. PATENT DOCUMENTS

| 2004/0136438 | A1* | 7/2004 | Fullerton | H03C 1/02 375/130 |
| 2007/0171994 | A1* | 7/2007 | Parker | H04L 1/08 375/260 |
| 2008/0171523 | A1 | 7/2008 | Anderson et al. | |
| 2009/0047902 | A1* | 2/2009 | Nory | H04W 52/10 455/13.4 |
| 2009/0302941 | A1* | 12/2009 | Wimpenny | H03F 1/0227 330/199 |
| 2010/0203854 | A1* | 8/2010 | Yu | H04L 27/20 455/127.1 |

(Continued)

FOREIGN PATENT DOCUMENTS

EP   2 200 183 A2   6/2010

OTHER PUBLICATIONS

European Search Report for European Application No. 13177138.8, Date Mailed: Dec. 6, 2013.

*Primary Examiner* — Ganiyu A Hanidu
(74) *Attorney, Agent, or Firm* — Hamilton, Brook, Smith & Reynolds, P.C.

(57) ABSTRACT

A method of providing a power supply of an amplifier of a wireless transmission system comprising, determining the power at an antenna when transmitting a signal to be transmitted by the amplifier, determining the modulation scheme for transmitting the signal, determining the frequency allocation of the signal to be transmitted, determining a transmit channel characteristic, and adjusting a parameter of the power supply of the amplifier based on the determining steps to maintain amplifier linearity.

13 Claims, 5 Drawing Sheets

(56) References Cited

U.S. PATENT DOCUMENTS

2012/0014349 A1* 1/2012 Chung ................ H04B 7/0684
                                                    370/329
2012/0064849 A1   3/2012 Langer et al.
2012/0088510 A1   4/2012 Akhi et al.
2013/0003890 A1* 1/2013 Schwent ............. H04L 27/2691
                                                    375/296
2013/0149972 A1* 6/2013 Luong .................. H04W 24/06
                                                    455/67.14

* cited by examiner

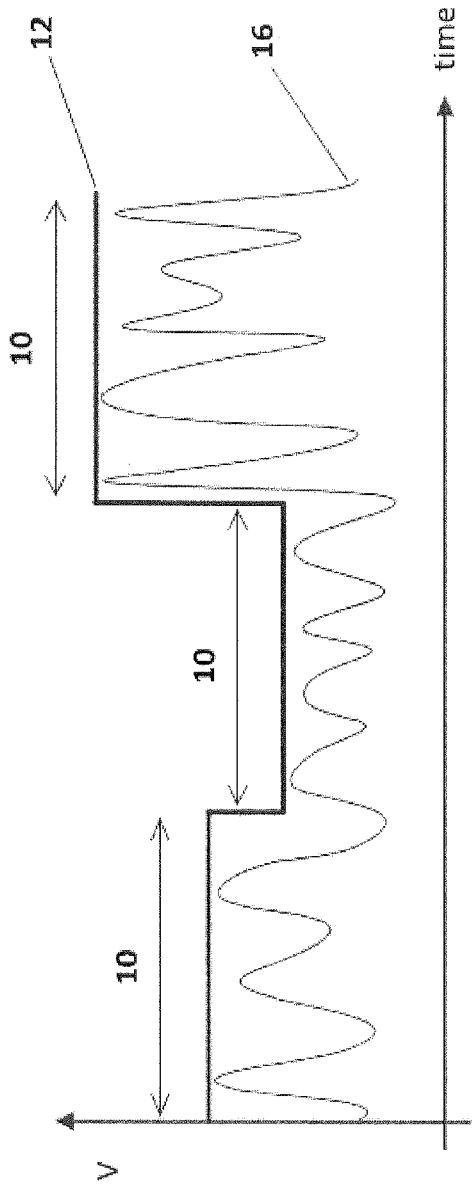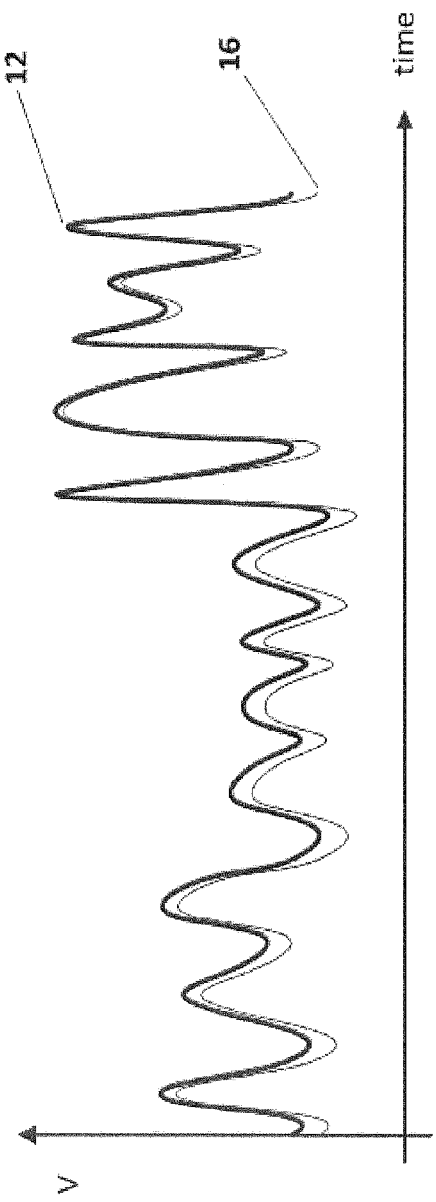
FIG. 1
FIG. 2

DYNAMIC AMPLIFIER SUPPLY

RELATED APPLICATION

This application claims priority under 35 U.S.C. §119 or 365 to European Application No. EP 13177138.8, filed Jul. 18, 2013. The entire teachings of the above application are incorporated herein by reference.

BACKGROUND

Typically, it is desired that the transmit chain of wireless communication systems exhibit good linearity (equal gain independent of signal amplitude and frequency). Any non-linearity may distort the transmitted signals so that the performance of the receiver at the other end of the communication link is degraded.

Non-linearity can also lead to unwanted spectral emissions in neighboring frequency channels or at out-of-band frequencies that would degrade the performance of communication equipment using the affected part of the frequency spectrum.

The linearity of a power amplifier of a transmit chain is often the dominant parameter for the overall transmitter linearity. Power amplifiers of class-A or class-AB are typically used to achieve good linearity. The linearity of these types of amplifiers can be limited by the voltage swing that may develop at the internal nodes of the amplifier. The voltage swing may be limited by the available supply voltage. Thus, limiting the supply voltage of these types of amplifiers typically degrades linearity but improves power efficiency.

Two known methods of reducing power amplifier current consumption are average power tracking (APT) and envelope tracking (ET).

In a system using APT, the supply voltage of the power amplifier is adjusted according to the desired transmit power level. The supply voltage is chosen such that sufficient linearity may be provided in order to meet all performance requirements for the required output power. FIG. 1 illustrates an APT scheme. As can be seen, for a period of time 10 the power amplifier supply voltage 12 is held at a constant level which is a function of the average signal power of signal 14 across duration 10. The power amplifier supply may be generated by a switched-mode power supply so that the reduced supply voltage is translated directly into a power saving from the overall system power supply.

In ET systems, the supply voltage of the power amplifier follows the envelope of the transmission system in real-time. FIG. 2 illustrates an ET scheme. The system may be based on a mapping function that relates the instantaneous signal magnitude 16 to the required power amplifier supply voltage 12. The system may be set up in order that all performance parameters such as adjacent channel rejection are met under all conditions. In particular, the mapping function may be chosen such that power amplifier linearity is maintained for all transmit configurations. The supply voltage 12 closely follows the signal magnitude 16 as can be seen. This minimizes the power amplifier voltage headroom and therefore maximizes the saving of power.

Whilst APT and ET schemes aim to save power and provide an efficient power amplifier whilst maintaining amplifier linearity, additional transmission characteristics of both the transmission scheme as a whole and also the signal to be transmitted are not taken into account.

Thus an improved control of amplifier power supply is desired that takes into account the signal to be transmitted and the transmission scheme in a more detailed manner whilst retaining amplifier linearity and improving efficiency.

SUMMARY

This invention relates to providing a dynamic amplifier supply. Embodiments relate to reducing amplifier current consumption by providing the amplifier supply as a function of operating parameters such as wireless communication modulation scheme and signal frequency allocation. It may be applied to, but is not limited to use with LTE networks.

The invention is set out in the claims. Optional features are defined in the dependent claims.

According to a first aspect there is provided a method of providing a power supply of an amplifier of a wireless transmission system comprising determining the power at an antenna when transmitting a signal to be transmitted by the amplifier, determining a frequency allocation of the signal to be transmitted, determining a transmit channel characteristic, determining the modulation scheme for transmitting the signal; and adjusting a parameter of the power supply of the amplifier based on the determining steps to maintain amplifier linearity.

Optionally, the method further comprises determining a power density limit of emissions in an adjacent transmit channel associated with the transmission of the signal.

Optionally, the supply parameter comprises a supply voltage to the amplifier

Optionally, the transmit channel characteristic comprises the transmit channel bandwidth.

Optionally, determining the frequency allocation of the signal to be transmitted comprises determining the position of the signal in relation to the center point of the bandwidth of the transmit channel.

Optionally, the transmit channel characteristic comprises the channel number.

Optionally, the method further comprises applying average power tracking of desired transmit power level when determining the power at the antenna.

Optionally, the method further comprises applying envelope tracking of desired transmit power level when determining the power at the antenna.

Optionally, the wireless transmission system comprises an LTE system.

Optionally, the determining the frequency allocation step further comprises determining a Resource Block allocation of the signal to be transmitted.

Optionally, the determining the frequency allocation step further comprises determining how the frequency allocation is distributed over a plurality of clusters.

Optionally, the determining the frequency allocation step further comprises determining a Resource Block Start value.

Optionally, determining a power density limit comprises determining an "$UTRA_{ACLR1}$" value.

Optionally, determining a power density limit comprises determining an "$E\text{-}UTRA_{ACLR}$" value.

Optionally, the method further comprises determining the LTE band of the signal to be transmitted.

Optionally, the method further comprises determining a network signaling variable of the transmission system.

Optionally, the network signaling variable comprises "NS_07".

Optionally, the average power tracking is applied over the time duration of one LTE subframe.

Optionally, the supply parameter is held above a predetermined minimum value.

Optionally, the wireless transmission system comprises a WIMAX system.

Optionally, the determining the frequency allocation step further comprises providing sub-channelization.

According to a second aspect there is provided a processor and associated memory comprising instructions which when executed, cause the processor to carry out one or more of the above method steps.

Optionally, the processor and associated memory wherein the instructions comprise a look-up table for adjusting the parameter of the supply based on the determining steps.

Optionally, a mobile device comprises the processor and associated memory.

Optionally, a base station comprises the processor and associated memory.

Optionally, the base station comprises an LTE eNodeB.

According to a third aspect there is provided a computer readable medium comprising instructions which when executed by a processor, cause the processor to carry out one or more of the above method steps.

With all the aspects, preferable and optional features are defined in the dependent claims.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

Embodiments will now be described, by way of example only, and with reference to the drawings in which:

FIG. 1 illustrates a known average power tracking scheme;

FIG. 2 illustrates a known envelope tracking scheme;

OVERVIEW

In the long term evolution (LTE) standard, transmitter linearity and therefore associated amplifier linearity may be constrained by a number of performance requirements, for example:

Out-of-band spurious emission requirements
Adjacent channel leakage requirements (ACLR)
Transmit signal spectral mask requirements
Signal quality requirements—error vector magnitude (EVM) and in-band emission specifications
Dependent on the LTE band in use, additional emission requirements may apply when the LTE network sends so-called 'network signaling values' (values NS_01 to NS_32 have been reserved, not all are currently used in systems).

Figure 3:
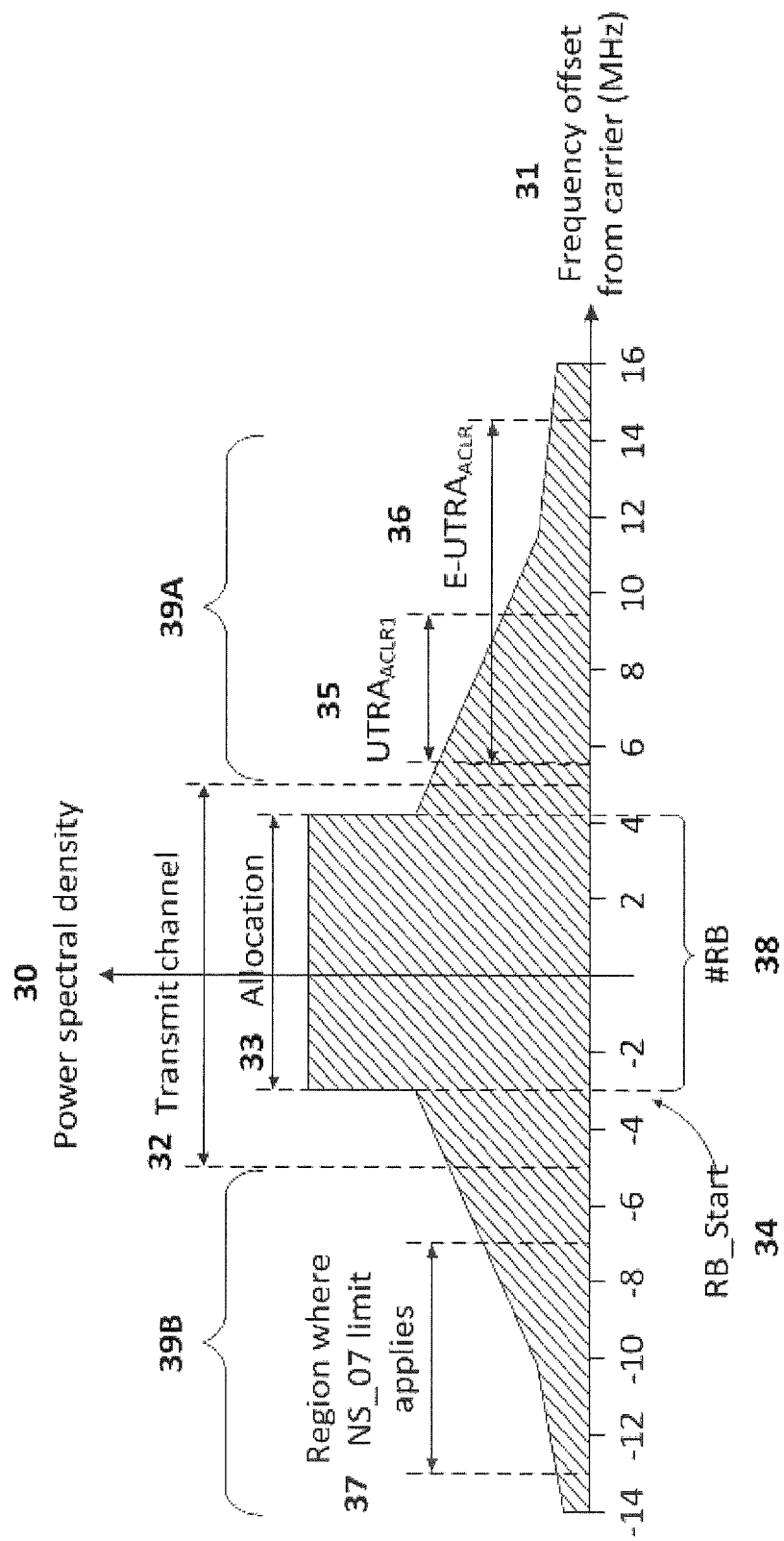
FIG. 3 illustrates an example power spectral density of a transmitted signal comprising a single cluster frequency allocation (within one transmit channel)

The configuration of the transmit signal can vary in a number of ways, for example:

Transmit signal power
Transmit signal carrier frequency
Transmit signal modulation scheme (for example QPSK, 16QAM or 64QAM)
Transmit signal channel bandwidth (for example 1.4, 3, 5, 10, 15, or 20 MHz for LTE)
Transmit signal frequency allocation, for example LTE resource block (RB) allocation (both number and location of resource blocks within a transmit channel)
Nature of transmit frequency allocation, for example whether the transmit signal is allocated in one contiguous region (a single cluster within one transmit channel as shown in FIG. 3) or a plurality of separate portions of the frequency domain (for example in LTE-Advanced this is known as multi-cluster allocation where the allocation may span more than one transmit channel)

To meet the above performance requirements for all possible transmit signal configurations over all conditions (such as but not limited to temperature, battery voltage supply, frequency) the system's amplifiers are typically provided with sufficient linearity (sufficient voltage headroom as would be understood) which leads to reduced amplifier efficiency.

Accordingly, the present application is directed towards providing an amplifier with a supply capable of maintaining linearity whilst reducing voltage headroom to improve efficiency of the amplifier by taking into account signal characteristics and other transmission characteristics.

The described method and systems are applicable to both envelope tracking and average power tracking schemes as well as both LTE and non-LTE transmission systems where the bandwidth and location of transmit power in a transmit channel is flexible (for example LTE-Advanced and WiMAX). In LTE-Advanced systems transmit signal frequency allocation may be defined over more than one transmit channel (known as multi-cluster) and in WiMAX systems, transmit signal frequency allocation may be provided by sub-channelization whereby groups of sub-carriers (individual data carriers) are combined and either used or left unused.

DETAILED DESCRIPTION

A description of example embodiments of the invention follows.

As discussed above, APT and ET schemes are capable of determining a power amplifier supply voltage from the average or instantaneous signal power. The supply may also be adjusted according to other parameters such as any of channel bandwidth, device temperature, battery voltage supply and sample-to-sample variations to ensure that sufficient power amplifier linearity headroom is maintained. For example, APT solutions exist where the power amplifier supply may be increased slightly in high temperature conditions or when transmitting near the edge of a frequency band (transmit channel)—see FIG. 3 and accompanying description.

As discussed in the overview section, the power amplifier supply voltage may also be derived as a function of modulation scheme, for example QPSK, 16QAM or 64QAM (or higher where applicable), of frequency allocation of the signal to be transmitted, for example 'RB allocation' of an LTE system, and optionally also of additional network criteria such as a 'network signaling value' of an LTE system. These additional criteria are equally applicable to both APT and ET schemes.

In the air interface of an LTE transmission scheme, the frequency allocation of a signal to be transmitted may be defined by the 'RB allocation'. Similar concepts for defining the frequency allocation of a transmission signal may apply to other or future wireless systems. FIG. 3 illustrates the power spectral density 30 of a signal corresponding to one possible transmit allocation of resource blocks 33, i.e. a transmit signal having a particular frequency allocation 33 allocated within a transmit channel with a bandwidth defined as 32. In the example of FIG. 3, the transmit signal does not occupy the full channel 32 but a narrower frequency space 33. The width of the allocation is characterized by the number of resource blocks 38 (between 1 and 50 may be allocated in a 10 MHz channel for example) and the lower frequency edge of the signal is characterized by a parameter 'RB_Start' 34. FIG. 3 illustrates a frequency allocation 33 occupying a single contiguous region in frequency (within one transmit channel). Other allocations are possible whereby the transmit power is distributed over several separate frequency regions (multi-cluster allocation).

The timeframe over which the frequency allocation is determined may be a few milliseconds i.e. the allocation may be a dynamic process.

FIG. 3 further shows unwanted emissions 39A, 39B that have spilled into frequencies adjacent the allocated transmit channel as the signal is transmitted. Typically, the unwanted emissions 39A, 39B are dominated by power amplifier non-linearity, in particular 3rd and 5th order inter-modulation products.

If the power amplifier supply voltage is increased, the power density of the unwanted emissions may reduce and if the power amplifier supply is reduced the emissions may increase as would be understood. The inter-modulation products fall into neighboring channels as can be seen from FIG. 3. These must be limited so as not to disturb services operating in the neighboring channels. Two limits applicable to LTE systems ($UTRA_{ACLR1}$ 35 and $E\text{-}UTRA_{ACLR}$ 36) are indicated in FIG. 3.

As can be seen from FIG. 3, the allocated frequency region 33 may not be symmetric around the carrier (see frequency offset 31). As a result, one of the neighboring channels may be affected by power amplifier inter-modulation products 39A more than the other. The closer the allocation of resource blocks 33 to the channel 32 edge (boundary) the more of the intermodulation product 39A, 39B will fall into the neighboring channel. If the allocation 33 is narrow and close to the channel center (minimal offset 31) then only a small proportion of the power of the intermodulation products will fall into the neighboring channels or bands. This allows an increase in the total inter-modulation power (and hence a lowering of the power amplifier supply voltage) which in turn, increases amplifier efficiency.

The following embodiment relates to a system employing APT for various resource block allocations (signal frequency allocations). FIGS. 4, 5, 7 and 8 are based on an LTE signal modulated using QPSK. For 16QAM a small supply voltage increase would be required to accommodate the increased peak-to-average power ratio of this modulation scheme.

Figure 4:
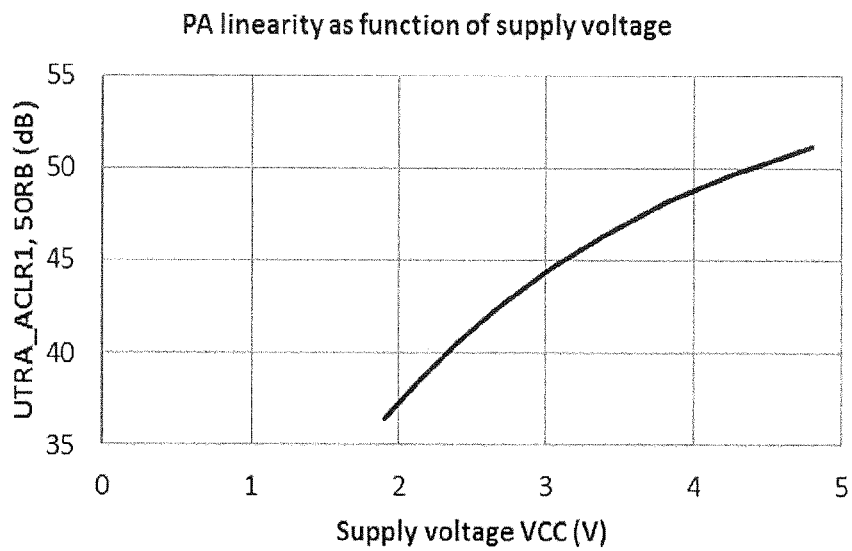
FIG. 4 illustrates power amplifier linearity as a function of supply voltage for a full bandwidth transmit signal (LTE frequency allocation of 50 RB)

At maximum output power of an antenna associated with the power amplifier, a relationship between $UTRA_{ACLR1}$ 35 (a power density limit of emissions in an adjacent transmit channel associated with the transmission of the signal) and supply voltage is assumed as shown in FIG. 4. Here, typical $UTRA_{ACLR1}$ versus supply voltage at 23 dBm antenna power is shown. $UTRA_{ACLR1}$ is evaluated for worst case fully occupied 10 MHz channel (50 resource blocks).

Figure 5:
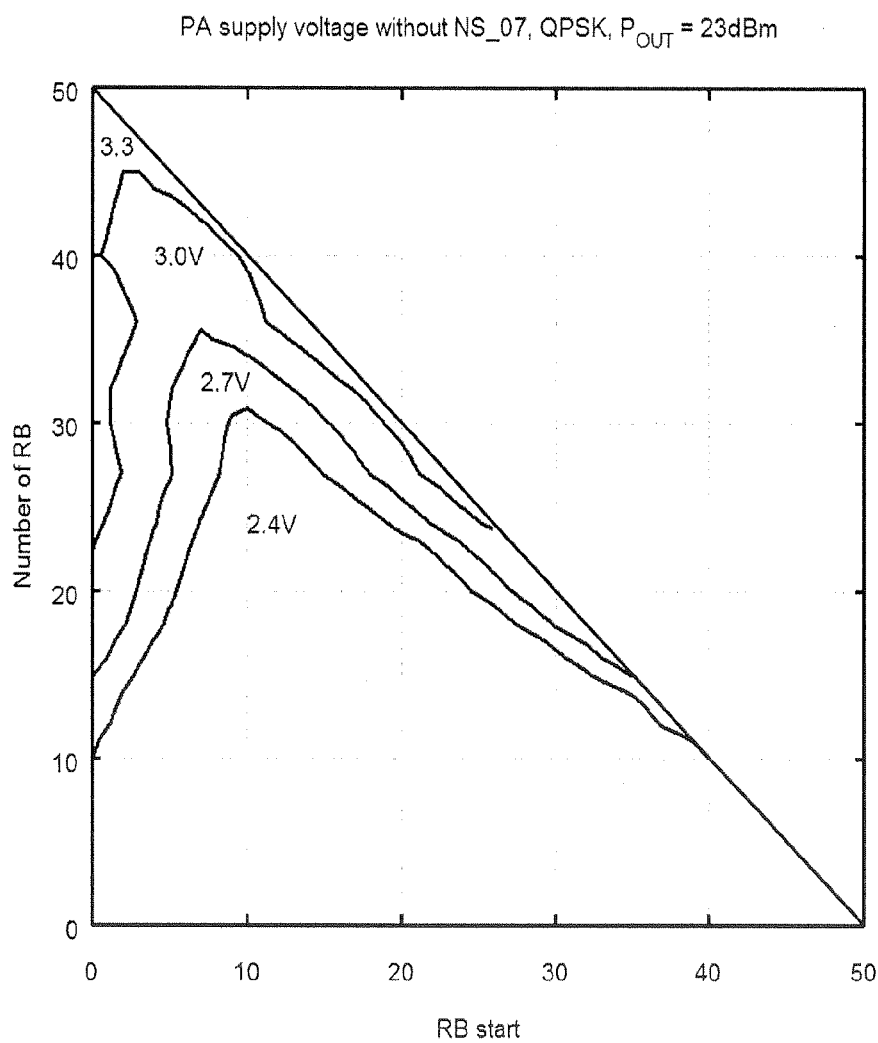
FIG. 5 illustrates supply voltage in relation to transmit signal frequency allocation according to an embodiment.

FIG. 5 shows the minimum supply voltage to the power amplifier necessary to keep all linearity constraints within limit for 23 dBm antenna power. The limiting requirement for large numbers of RB (wide frequency allocation for the signal) is $UTRA_{ACLR1}$ which is assumed to be at least 42 dB under typical conditions (supply voltage=2.4V). For small resource block allocations 33 (narrow frequency allocation for the signal), EVM (error vector magnitude) becomes limiting. The EVM is also dominated by third-order inter-modulation products which fall into the frequency locations occupied by the desired transmit signal. It has been assumed that the power amplifier may contribute 4% EVM.

FIG. 5 illustrates minimum power amplifier supply voltage as a function of signal width (number of resource blocks allocated 38 (RB) and location within the channel 34 (RB start) based on a single cluster frequency allocation for the transmit signal. As can be seen, the supply voltage is increased for higher number of RB in order to reduce the unwanted emissions spilling into neighboring frequencies. For most RB allocations, the supply may be kept lower.

For low numbers of resource blocks the supply voltage is kept above a certain level (2.4V in this case) in order to guarantee the in-band signal quality. A lower voltage would degrade in-band emissions and EVM.

As can be seem from FIG. 5, from about 10 resource blocks upwards, the supply is raised if the signal constellation is close to the transmit channel boundary (at RB_Start=0 or maximum applicable RB_Start value). In general, the higher the RB allocation the higher the supply as can be seen.

The supply voltage is therefore a function of average signal power (as in any APT system), of number of resource blocks and RB_Start value (signal spectral width and location within the channel) and of modulation scheme.

A multi-dimensional look-up table maybe used to find the optimum supply voltage for given conditions. A mathematical model describing the relation between optimum supply voltages, average power, signal frequency allocation which may comprise spectral width and location within the channel (RB number and RB_Start value) and modulation scheme may also be used to provide supply voltage information on the fly.

When the transmit power is distributed over several separate frequency regions (multi-cluster allocation), the peak-to-average power increases and therefore the supply voltage is typically increased accordingly. The same principles as described herein may also be applied to multi-cluster allocation schemes.

Figure 6:
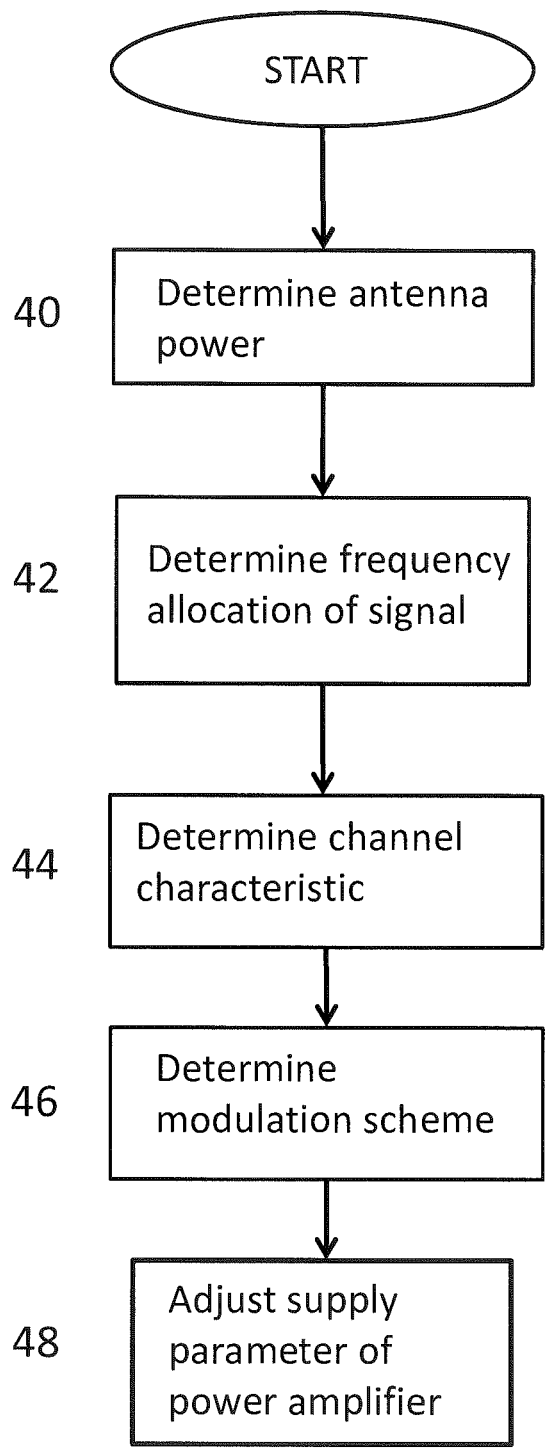
FIG. 6 illustrates a method according to an embodiment.

Accordingly a method as illustrated in FIG. 6 is provided. The method may comprise a series of determining steps and an adjustment step. The determining steps may comprise determining variables relating to an amplifier of a wireless transmission system.

In step 40, the transmit power of an antenna associated with the power amplifier and transmitting the signal of interest is determined. This may comprise using an average power tracking scheme or an envelope tracking scheme.

At step 42, the frequency allocation (width and location of the signal to be transmitted) is determined. In an LTE system, this may comprise determining the number of RB allocated to the signal and/or the RB_Start value. In an LTE-Advanced or other multi-cluster system, the number, location and individual width of allocated clusters may also be determined.

At step 44, at least one characteristic of the transmit channel of the signal to be transmitted is determined. This may comprise determining the channel number (equivalent to carrier frequency) or channel bandwidth. This may also comprise determining the position of the channel boundaries, the channel center point and/or the frequency offset in relation to a carrier frequency of the channel.

At step 46, the modulation scheme to be used for transmitting the signal is determined, for example whether QPSK, 16QAM or 64QAM is used.

At step 48, a parameter of the power supply of the power amplifier is adjusted based on the previously determined values. This may comprise adjusting a supply voltage to maintain acceptable noise level or power density limit in adjacent transmit channels and/or frequencies.

Additionally, network signaling conditions may also be taken into account. For example, in LTE band 13, the system must be able to adjust to a value called 'NS_07' which requires that emissions 2-8 MHz away from the channel edge must be kept below −57 dBm measured across 6.25 kHz.

Figure 7:
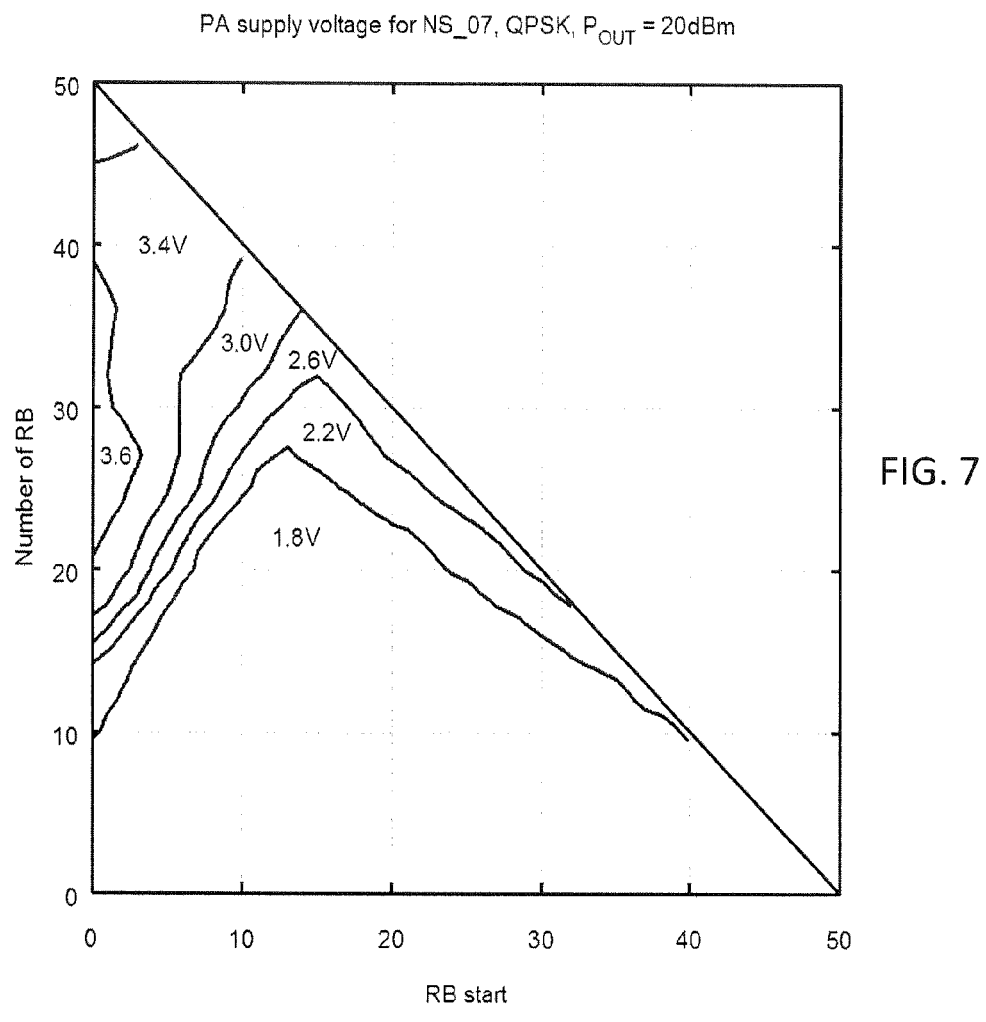
FIG. 7 illustrates supply voltage in relation to transmit signal frequency allocation and additional network signaling value according to an embodiment.

'NS_07' conditions may be met by reducing the transmitting antenna output power which also reduces the available transmit range or throughput. NS_07 conditions may also be met by further improving the power amplifier linearity, in other words by more accurately controlling the amplifier supply in relation to the signal to be transmitted. FIG. 7 shows the power amplifier supply voltage assuming a 3 dB back-off of antenna power to 20 dBm compared to the conditions of FIG. 5.

Optional additional steps may comprise taking into account other network signalling criteria such as determining a network signaling value or variable (for example NS_07 in LTE) as well as determining the band to be used for transmission.

At step 48, a look-up table may be used to adjust a parameter of the power supply of the amplifier by taking into account one or more of the various determined antenna power, frequency allocation, transmit channel characteristic, modulation scheme and any other determined variables or characteristics of the transmission scheme.

The reduced power amplifier voltage translates directly into a power saving if a DC/DC convertor with programmable supply level is used as would be understood. The current drawn by the power amplifier is only very weakly dependent on the supply voltage so a drop of voltage by half means power amplifier power consumption is halved and power amplifier efficiency is doubled.

Figure 8:
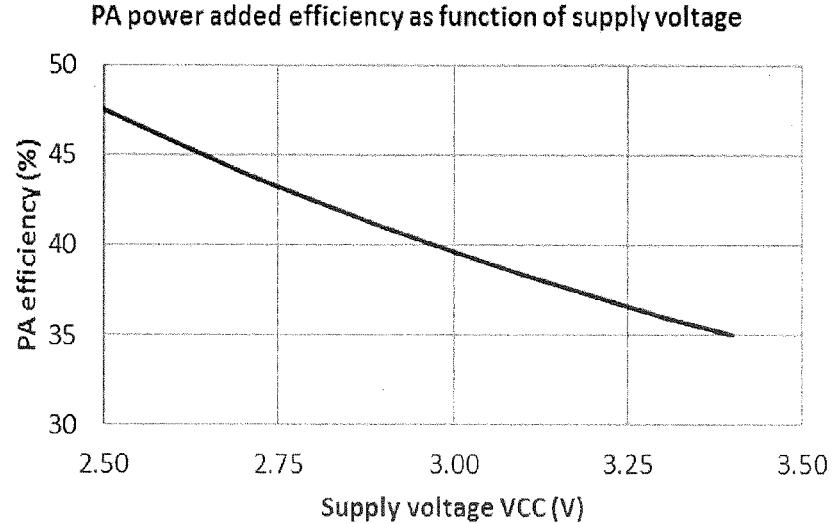
FIG. 8 illustrates resultant efficiency improvement according to an embodiment.

The results of the efficiency savings are shown in FIG. 8 (assuming amplifier current consumption remains constant over supply voltage) in relation to an assumed power amplifier efficiency of 35% at 3.4V supply. As is seen, the efficiency increases with reduced supply voltage whilst maintaining NS_07 conditions.

Another condition that may be taken into account is the proximity to other transmitters (radios) operating nearby. For example, if cellular and WLAN/Bluetooth transceivers operate in the same system or product, mutual interference may be minimized if the supply voltage to the power amplifier associated with the two transceivers is adjusted depending on the exact transmit characteristics. For example, the linearity of an LTE or WiMAX transmitter operating in the 2.3-2.4 GHz band could be boosted by increasing the supply voltage whenever a channel near the 2.4 GHz upper end of the frequency band is used.

In summary, the embodiments described herein apply to an APT system. The duration over which the average is calculated may comprise an LTE subframe or equivalent timeframe of another transmission scheme.

An analogous strategy can be applied to ET systems as well. In an ET system, the required amplifier supply voltage is calculated directly from the instantaneous signal magnitude. The mapping between signal magnitude and voltage is performed such that the amplifier is kept as linear as necessary to comply with in-band and out-of-band emission requirements. A common approach is to choose a supply voltage that keeps the amplifier gain constant across the whole signal swing range. With the disclosed method, the power amplifier linearity may be permitted to degrade in certain conditions thereby lowering the average supply voltage and optimizing efficiency further.

In general, for RB allocations with few resource blocks (narrow frequency spectrum) or resource blocks further away from either the channel boundary or restricted emissions region, the mapping functions or mathematical models can be adjusted such that a lower voltage is supplied to the power amplifier. This may render the power amplifier increasingly non-linear, however, this is acceptable as long as all in-band and out-of-band signal quality requirements are met.

These schemes may be employed at either a base station, for example an eNodeB LTE base station or user equipment (UE) such as a portable electronic device comprising a mobile phone or tablet for example.

In general, in LTE systems, the base station (eNodeB) dictates what frequency allocation the UE transmitter should use. A list of resource blocks is sent to a handset and a signal modulator of the UE transmitter system builds up the signal out of individual frequency components based on the list.

Additionally, the eNodeB may anticipate that the UE may be capable of lowering its power consumption for RB allocations near the transmit channel center and may therefore request the UE to transmit at these RB allocations. In that way the eNodeB can help the UE to reduce power consumption. To this end, the eNodeB may instruct all UEs in advance regarding how many and which resource blocks to use for transmission of a signal. The allocation of the available spectrum amongst the UEs in a cell takes into account a large number of parameters. If the eNodeB determines that the UE power consumption will be in line with the efficiency results presented herein, then the scheduling of RB allocations can be optimized to assist the UEs with lowering power. For example, wider allocations should preferably be scheduled around the channel center whereas for narrow allocations nearer the channel edge is preferable.

In the foregoing, the constraints of unwanted adjacent channel interference (ACLR) and error vector magnitude (EVM) are taken into account. Second and third harmonics may also be parameters that determine power amplifier setup depending on the LTE bands in use. The band in use may therefore also be considered when characterizing the power amplifier under consideration.

A benefit of the proposed scheme is to lower the power amplifier supply voltage for most RB allocations and low modulation schemes (e.g. QPSK) which allows enhancements of system power efficiency over known average power tracking and envelope tracking schemes.

Accordingly a dynamic power amplifier supply is provided capable of increasing the efficiency of signal transmission by taking additional transmission parameters into account that aid the determination of supply conditions.

While this invention has been particularly shown and described with references to example embodiments thereof, it will be understood by those skilled in the art that various changes in form and details may be made therein without departing from the scope of the invention encompassed by the appended claims.

What is claimed is:

1. A method of providing a power supply of an amplifier of a wireless transmission system comprising:
   determining a power at an antenna when transmitting a signal to be transmitted by the amplifier;
   determining a frequency allocation of the signal to be transmitted;
   determining a transmit channel characteristic;
   determining a modulation scheme for transmitting the signal; and
   adjusting a parameter of the power supply of the amplifier based on the determining steps to maintain amplifier linearity;
   wherein the transmit channel characteristic comprises the transmit channel bandwidth and wherein determining the frequency allocation of the signal to be transmitted comprises determining the position of the signal in relation to the center point of the bandwidth of the transmit channel.

2. The method of claim 1 further comprising determining a power density limit of emissions in an adjacent transmit channel associated with the transmission of the signal.

3. The method of claim 1 wherein the supply parameter comprises a supply voltage to the amplifier.

4. The method of claim 1 further comprising applying average power tracking of desired transmit power level when determining the power at the antenna.

5. The method of claim 1 further comprising applying envelope tracking of desired transmit power level when determining the power at the antenna.

6. The method of claim 1 wherein determining the frequency allocation of the signal further comprises determining a Resource Block allocation of the signal to be transmitted.

7. The method of claim 1 wherein determining the frequency allocation of the signal further comprises determining how the frequency allocation is distributed over a plurality of clusters.

8. The method of claim 6 wherein determining the frequency allocation of the signal further comprises determining a Resource Block Start value.

9. The method of claim 1 further comprising determining the LTE band of the signal to be transmitted.

10. The method of claim 1 wherein the average power tracking is applied over the time duration of one LTE subframe.

11. The method according to of claim 1 wherein the supply parameter is held above a pre-determined minimum value.

12. A processor and associated memory comprising instructions which when executed, cause the processor to
   determine a power at an antenna when transmitting a signal to be transmitted by an amplifier of a wireless transmission system;
   determine a frequency allocation of the signal to be transmitted;
   determine a transmit channel characteristic;
   determine a modulation scheme for transmitting the signal; and
   adjust a parameter of a power supply of the amplifier based on the determining steps to maintain amplifier linearity;
   wherein the transmit channel characteristic comprises the transmit channel bandwidth and wherein to determine the frequency allocation of the signal to be transmitted comprises to determine the position of the signal in relation to the center point of the bandwidth of the transmit channel.

13. A non-transitory computer readable medium comprising instructions which when executed by a processor, cause the processor to
   determine a power at an antenna when transmitting a signal to be transmitted by an amplifier of a wireless transmission system;
   determine a frequency allocation of the signal to be transmitted;
   determine a transmit channel characteristic;
   determine a modulation scheme for transmitting the signal; and
   adjust a parameter of a power supply of the amplifier based on the determining steps to maintain amplifier linearity;
   wherein the transmit channel characteristic comprises the transmit channel bandwidth and wherein to determine the frequency allocation of the signal to be transmitted comprises to determine the position of the signal in relation to the center point of the bandwidth of the transmit channel.

* * * * *